United States Patent
Ihara et al.

(10) Patent No.: US 11,594,427 B2
(45) Date of Patent: Feb. 28, 2023

(54) SUBSTRATE PROCESSING APPARATUS AND SUBSTRATE PROCESSING METHOD

(71) Applicant: Tokyo Electron Limited, Tokyo (JP)

(72) Inventors: Toru Ihara, Koshi (JP); Gentaro Goshi, Koshi (JP); Masami Yamashita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 60 days.

(21) Appl. No.: 17/102,502

(22) Filed: Nov. 24, 2020

(65) Prior Publication Data

US 2021/0159095 A1 May 27, 2021

(30) Foreign Application Priority Data

Nov. 25, 2019 (JP) .............................. JP2019-212546

(51) Int. Cl.
*H01L 21/67* (2006.01)
*H01L 21/02* (2006.01)
*B08B 7/00* (2006.01)

(52) U.S. Cl.
CPC ...... *H01L 21/67034* (2013.01); *B08B 7/0021* (2013.01); *H01L 21/02101* (2013.01); *H01L 21/67207* (2013.01)

(58) Field of Classification Search
CPC ......... H01L 21/02101; H01L 21/67034; H01L 21/00–86
See application file for complete search history.

(56) References Cited

U.S. PATENT DOCUMENTS

| | | | |
|---|---|---|---|
| 2003/0198895 A1* | 10/2003 | Toma ................. | H01L 21/02203 430/314 |
| 2007/0012337 A1* | 1/2007 | Hillman ............ | H01L 21/02101 700/121 |
| 2014/0250714 A1* | 9/2014 | Ji ...................... | H01L 21/02057 34/275 |
| 2018/0096863 A1* | 4/2018 | Goshi ............... | H01L 21/02057 |
| 2018/0366348 A1* | 12/2018 | Cho .................. | H01L 21/67173 |

FOREIGN PATENT DOCUMENTS

JP 2018-074103 A 5/2018

* cited by examiner

*Primary Examiner* — Mikhail Kornakov
*Assistant Examiner* — Richard Z. Zhang
(74) *Attorney, Agent, or Firm* — Pearne & Gordon LLP

(57) ABSTRACT

A substrate processing apparatus performs increasing a pressure within a processing vessel up to a processing pressure higher than a threshold pressure of a processing fluid by supplying the processing fluid into the processing vessel in which a substrate having thereon a liquid is accommodated; and supplying the processing fluid into the processing vessel and draining the processing fluid while maintaining the pressure within the processing vessel at a level allowing the processing fluid to be maintained in a supercritical state. The increasing of the pressure includes: increasing the pressure to a first pressure; and increasing the pressure to the processing pressure from the first pressure. A temperature of the substrate is controlled to a first temperature in the increasing of the pressure to the first pressure, and is controlled to a second temperature higher than the first temperature in the increasing of the pressure to the processing pressure.

6 Claims, 13 Drawing Sheets

SUBSTRATE PROCESSING APPARATUS AND SUBSTRATE PROCESSING METHOD

CROSS-REFERENCE TO RELATED APPLICATION

This application claims the benefit of Japanese Patent Application No. 2019-212546 filed on Nov. 25, 2019, the entire disclosure of which is incorporated herein by reference.

TECHNICAL FIELD

The various aspects and embodiments described herein pertain generally to a substrate processing apparatus and a substrate processing method.

BACKGROUND

In a semiconductor device manufacturing process of forming a stacked structure of an integrated circuit on a surface of a substrate such as a semiconductor wafer (hereinafter, simply referred to as "wafer"), a liquid processing such as chemical liquid cleaning or wet etching is performed. To remove a liquid or the like which is attached on the surface of the wafer in the liquid processing, a drying method using a processing fluid in a supercritical state has been recently used.

Patent Document 1 describes a substrate processing apparatus in which a first fluid supply is provided under a substrate held by a substrate holder and a second fluid supply is provided at a lateral side of the substrate held by the substrate holder.

Patent Document 1: Japanese Patent Laid-open Publication No. 2018-074103

SUMMARY

In one exemplary embodiment, there is provided a substrate processing apparatus configured to dry a substrate, which has a liquid attached on a surface thereof, by using a processing fluid in a supercritical state. The substrate processing apparatus includes a processing vessel configured to accommodate the substrate therein; a substrate holder configured to hold the substrate horizontally such that the surface of the substrate faces upwards within the processing vessel; a fluid supply unit configured to supply a processing fluid into the processing vessel; a fluid drain unit configured to drain the processing fluid from the processing vessel; and a controller configured to control at least operations of the fluid supply unit and the fluid drain unit and a temperature of the substrate held by the substrate holder. The controller controls the operations of the fluid supply unit and the fluid drain unit to perform: increasing a pressure within the processing vessel up to a processing pressure higher than a threshold pressure of the processing fluid by supplying the processing fluid into the processing vessel in which the substrate having the liquid attached on the surface thereof is accommodated; and supplying the processing fluid into the processing vessel and draining the processing fluid from the processing vessel while maintaining the pressure within the processing vessel at a level allowing the processing fluid to be maintained in the supercritical state, after the pressure within the processing vessel is increased to the processing pressure. The increasing of the pressure within the processing vessel up to the processing pressure includes: increasing the pressure within the processing vessel to a first pressure higher than the threshold pressure and lower than the processing pressure; and increasing the pressure within the processing vessel to the processing pressure from the first pressure. The controller controls the temperature of the substrate to a first temperature in the increasing of the pressure within the processing vessel to the first pressure, and the controller controls the temperature of the substrate to a second temperature higher than the first temperature in the increasing of the pressure within the processing vessel to the processing pressure.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
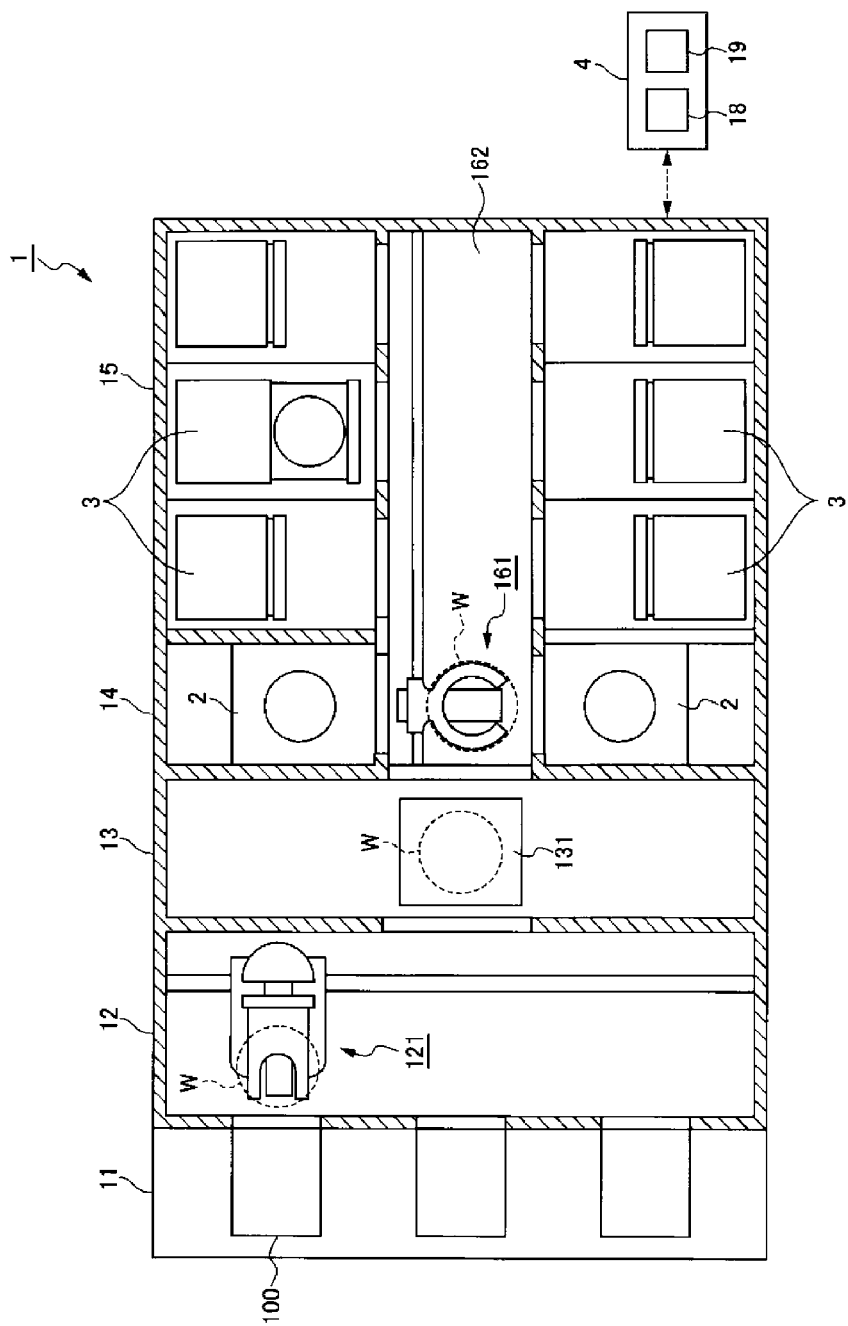
FIG. 1 is a transversal plan view illustrating an overall configuration of a substrate processing system.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, various exemplary embodiments of the present disclosure will be described with reference to the accompanying drawings. In the various drawings, same or corresponding parts will be assigned same or corresponding reference numerals, and redundant description may be omitted.

[Configuration of Substrate Processing System]

As depicted in FIG. 1, a substrate processing system 1 is equipped with a plurality of cleaning apparatuses 2 (two cleaning apparatuses 2 in the example shown in FIG. 1) configured to perform a cleaning processing by supplying a cleaning liquid onto a wafer W; and a multiple number of supercritical processing apparatuses 3 (six supercritical processing apparatuses 3 in the example shown in FIG. 1) configured to remove a liquid (in the present exemplary embodiment, IPA (Isopropyl Alcohol)) for dry prevention attached on the wafer W after the cleaning processing by allowing the liquid to come into contact with a processing fluid (in the present exemplary embodiment, $CO_2$ (carbon dioxide)) in a supercritical state.

In this substrate processing system 1, a FOUP (Front-Opening Unified Pod) 100 is placed in a placing unit 11, and a wafer W stored in this FOUP 100 is transferred to a cleaning processing unit 14 and a supercritical processing unit 15 via a carry-in/out section 12 and a delivery unit 13. In the cleaning processing unit 14 and the supercritical processing unit 15, the wafer W is first carried into a cleaning apparatus 2 provided in the cleaning processing unit 14 to be subjected to the cleaning processing, and then carried into a supercritical processing apparatus 3 provided in the supercritical processing unit 15 to be subjected to a drying processing of removing the IPA from the wafer W. In FIG. 1, a reference numeral 121 denotes a first transfer device configured to transfer the wafer W between the FOUP 100 and the delivery unit 13, and a reference numeral 131 denotes a delivery shelf serving as a buffer in which the wafer W which is transferred between the carry-in/out section 12 and the cleaning processing unit 14/supercritical processing unit 15 is temporarily placed.

A wafer transfer path 162 is connected to an opening of the delivery unit 13, and the cleaning processing unit 14 and the supercritical processing unit 15 are arranged along the wafer transfer path 162. In the cleaning processing unit 14, a single cleaning apparatus 2 is disposed at each side of the wafer transfer path 162, so two cleaning apparatuses 2 are provided in total. Meanwhile, in the supercritical processing unit 15, three supercritical processing apparatuses 3 serving as a substrate processing apparatus configured to perform a drying processing of removing IPA from the wafer W are disposed at each side of the wafer transfer path 162, so six supercritical processing apparatuses 3 are provided in total. In the wafer transfer path 162, a second transfer device 161 is configured to be movable within the wafer transfer path 162. The wafer W placed on the delivery shelf 131 is received by the second transfer device 161, and the second transfer device 161 carries the wafer W into the cleaning apparatus 2 and the supercritical processing apparatus 3. Further, the numbers and the layouts of the cleaning apparatuses 2 and the supercritical processing apparatuses 3 are not particularly limited, and an appropriate number of cleaning apparatuses 2 and an appropriate number of supercritical processing apparatuses 3 may be arranged in an appropriate layout based on the number of wafers W processed per unit time, processing times of the cleaning apparatus 2 and the supercritical processing apparatuses 3, and so forth.

The cleaning apparatus 2 is configured as a single wafer type apparatus configured to clean wafers W one by one by, for example, spin cleaning. In this case, the cleaning apparatus 2 is capable of performing the cleaning processing upon the wafer W by supplying a chemical liquid for cleaning or a rinse liquid for washing the chemical liquid away onto a processing surface of the wafer W at an appropriate time while rotating the wafer W around a vertical axis in the state that the wafer W is held horizontally. The chemical liquid and the rinse liquid used in the cleaning apparatus 2 are not particularly limited. By way of example, by supplying a SC1 solution as an alkaline chemical liquid (that is, a mixed solution of ammonia and hydrogen peroxide) onto the wafer W, a particle or an organic contaminant can be removed from the wafer W. Then, by supplying DIW (Deionized Water) as a rinse liquid onto the wafer W, the SC1 solution can be washed away from the wafer W. Further, it may be also possible to remove a natural oxide film by supplying DHF (Diluted HydroFluoric acid) as an acidic chemical liquid onto the wafer W and then wash the DHF from the wafer W by supplying DIW onto the wafer W.

After the rinsing processing by the DIW is finished, the cleaning apparatus 2 supplies the IPA as the liquid for dry prevention to the wafer W while rotating the wafer W, thus allowing the DIW remaining on the processing surface of the wafer W to be replaced by the IPA. Then, the cleaning apparatus 2 stops the rotation of the wafer W slowly. At this time, a sufficient amount of the IPA is supplied onto the wafer W, so the IPA is accumulated on a surface of the wafer W on which a semiconductor pattern is formed. As a result, a liquid film of the IPA is formed on the surface of the wafer W. This wafer W is carried out from the cleaning apparatus 2 by the second transfer device 161 while maintaining this state in which the IPA is accumulated on the surface thereof.

The IPA applied on the surface of the wafer W as described above serves to suppress the wafer W from being dried. Particularly, to suppress a so-called pattern collapse from happening on the wafer W due to evaporation of the IPA while the wafer W is being transferred from the cleaning apparatus 2 to the supercritical processing apparatus 3, the cleaning apparatus 2 applies the sufficient amount of the IPA onto the wafer W so that the liquid film of the IPA having a relatively large thickness is formed on the surface of the wafer W.

The wafer W taken out of the cleaning apparatus 2 is carried by the second transfer device 161 into a processing vessel of the supercritical processing apparatus 3 in the state that the IPA is accumulated on the surface of the wafer W. Then, the drying processing of removing the IPA is performed in the supercritical processing apparatus 3.

[Supercritical Processing Apparatus]

Now, a common configuration of the supercritical processing apparatus 3 in various exemplary embodiments will be explained with reference to FIG. 2 to FIG. 4.

Figure 2:
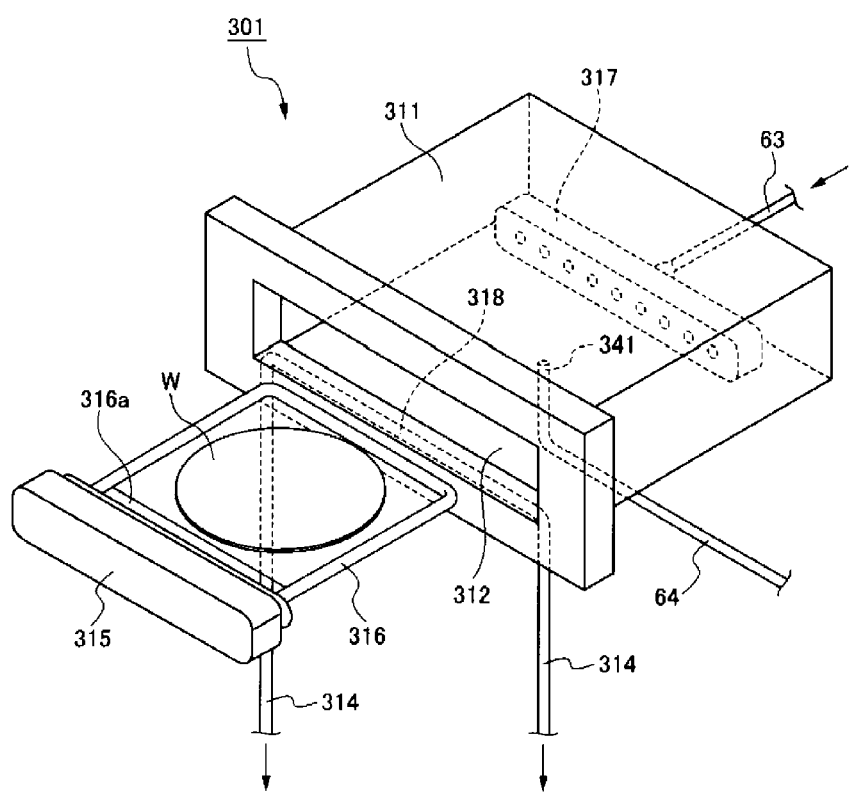
FIG. 2 is an exterior perspective view illustrating a processing vessel of a supercritical processing apparatus.
Figure 3:
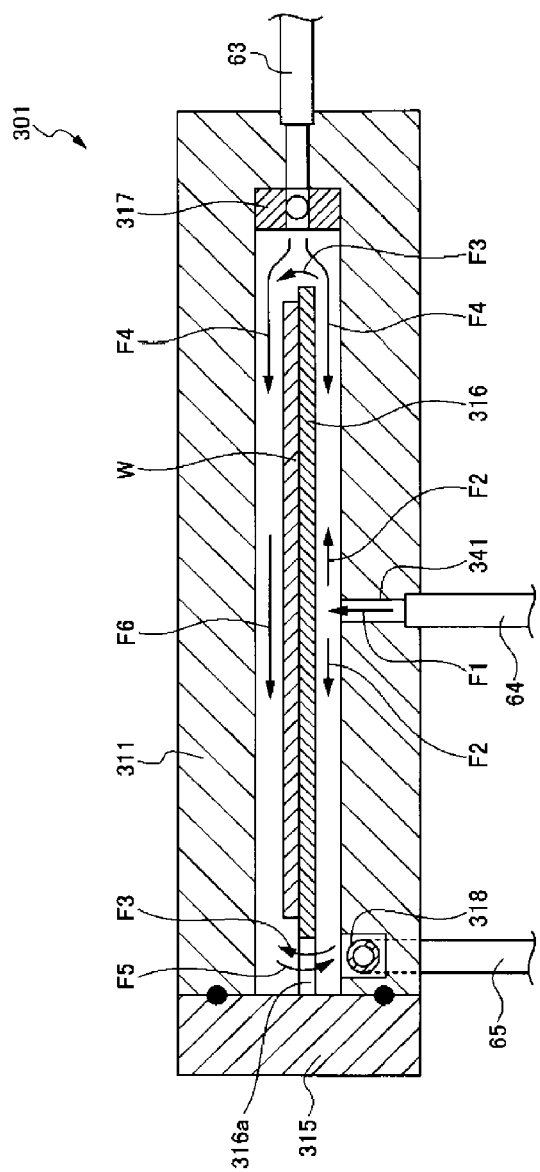
FIG. 3 is a cross sectional view of the processing vessel.

As depicted in FIG. 2 and FIG. 3, a processing vessel 301 includes a vessel main body 311 having an opening 312 for a carry-in/out of the wafer W; a holding plate 316 configured to hold the wafer W as a processing target horizontally; and a cover member 315 supporting the holding plate 316 and configured to seal the opening 312 when the wafer W is carried into the vessel main body 311.

The vessel main body 311 is a container having therein a space in which the wafer W having a diameter of, e.g., 300 mm can be accommodated. A fluid supply header 317 is provided at one end portion within the vessel main body 311, and a fluid drain header 318 is provided at the other end portion therein. In the shown example, the fluid supply header 317 is composed of a block body having a multiple number of openings, and the fluid drain header 318 is composed of a pipe having a multiple number of openings (fluid drain opening). Desirably, a first fluid supply port of the fluid supply header 317 is located at a position slightly higher than a top surface of the wafer W held by the holding plate 316.

The configuration of the fluid supply header 317 and the fluid drain header 318 is not limited to the shown example. By way of example, the fluid drain header 318 may be formed of a block body, and the fluid supply header 317 may be formed of a pipe.

When viewed from below, the holding plate 316 covers almost the whole region of a bottom surface of the wafer W. The holding plate 316 has an opening 316a at an end portion thereof at a cover member 315 side. The processing fluid in a space above the holding plate 316 is guided to the fluid drain header 318 through the opening 316a (as indicated by an arrow F5 in FIG. 3).

The fluid supply header 317 supplies the processing fluid into the vessel main body 311 (processing vessel 301) in a substantially horizontal direction. Here, the horizontal direction refers to a direction perpendicular to a vertical direction in which gravity works. Typically, the horizontal direction is a direction parallel to a direction in which a flat surface of the wafer W held by the holding plate 316 is extended.

A fluid within the processing vessel 301 is drained to an outside of the processing vessel 301 through the fluid drain header 318. The fluid drained through the fluid drain header 318 includes, besides the processing fluid supplied into the processing vessel 301 through the fluid supply header 317, the IPA dissolved in the processing fluid after once being attached on the surface of the wafer W.

A fluid supply nozzle 341 configured to supply the processing fluid into the processing vessel 301 is provided at a bottom of the vessel main body 311. In the shown example, the fluid supply nozzle 341 is formed of an opening bored in a bottom wall of the vessel main body 311. The fluid supply nozzle 341 is located under (for example, directly under) a central portion of the wafer W, and supplies the processing fluid into the processing vessel 301 toward the central portion of the wafer W (for example, vertically upwards).

The processing vessel 301 is also equipped with a non-illustrating pressing device. This pressing device has a function of sealing a processing space by pressing the cover member 315 toward the vessel main body 311 against an internal pressure caused by the processing fluid in a supercritical state supplied into the processing space. Further, it is desirable to provide an insulator, a tape heater, or the like (not shown) at a ceiling wall and the bottom wall of the vessel main body 311 so that the processing fluid supplied into the processing space is capable of maintaining its temperature in the supercritical state.

Figure 4:
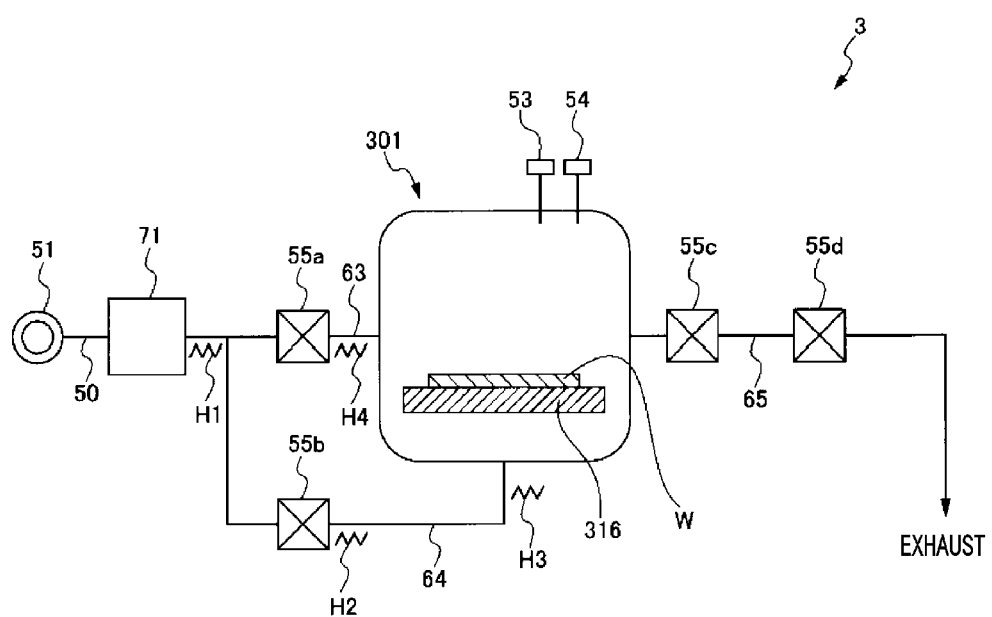
FIG. 4 is a diagram illustrating a piping system of the supercritical processing apparatus.

As shown in FIG. 4, the supercritical processing apparatus 3 has a fluid supply tank 51 serving as a supply source for the processing fluid. A main supply line 50 is connected to the fluid supply tank 51. This main supply line 50 is branched into a first supply line 63 connected to the fluid supply header 317 within the processing vessel 301 and a second supply line 64 connected to the fluid supply nozzle 341.

A vaporizer 71 and an opening/closing valve 55a are provided between the fluid supply tank 51 and the fluid supply header 317 (that is, at the main supply line 50 and the first supply line 63 led from it) in this sequence from an upstream side. The vaporizer 71 vaporizes the processing fluid supplied from the fluid supply tank 51 and supplies a gas of a preset temperature to a downstream side. The second supply line 64 is branched from the main supply line 50 at a position between the vaporizer 71 and the opening/closing valve 55a. The second supply line 64 is provided with an opening/closing valve 55b.

A drain line 65 is connected to the fluid drain header 318 within the processing vessel 301. The drain line 65 is provided with an opening/closing valve 55c and a pressure control valve 55d in sequence from the upstream side. A degree of openness of the pressure control valve 55d is adjusted by the controller 4. The controller 4 performs, by way of example, a PID (Proportional-Integral-Differential) control of the degree of openness of the pressure control valve 55d.

A line heater H1 is provided between the vaporizer 71 and the opening/closing valves 55a and 55b. Line heaters H2 and H3 are provided between the opening/closing valve 55b and the fluid supply nozzle 341. The line heater H2 is disposed upstream of the line heater H3. A line heater H4 is provided between the opening/closing valve 55a and the fluid supply header 317. Set temperatures of the line heaters H1 to H4 can be controlled independently by the controller 4.

Pressure sensors configured to detect a pressure within a line and temperature sensors configured to detect a temperature of a fluid are provided at various places of lines of the supercritical processing apparatus 3 through which the fluid flows. Further, a pressure sensor 53 configured to detect a pressure within the processing vessel 301 and a temperature sensor 54 configured to detect a temperature of the fluid within the processing vessel 301 are provided.

The controller 4 receives measurement signals from the various sensors (the pressure sensor 53, the temperature sensor 54, and so forth) shown in FIG. 4, and sends control signals (opening/closing signals for the opening/closing valves 55a to 55c, an openness degree signal for the pressure control valve 55d, and so forth) to the various functional elements. The controller 4 may be, by way of example, a computer, and includes an operation unit 18 and a storage unit 19. The storage unit 19 stores therein a program for controlling various processing performed in the substrate processing system 1. The operation unit 18 controls an operation of the substrate processing system 1 by reading and executing the program stored in the storage unit 19. The program is recorded on a computer-readable recording medium and may be installed from this recording medium to the storage unit 19 of the controller 4. The computer-readable recording medium may be, by way of example, but not limitation, a hard disk (HD), a flexible disk (FD), a compact disk (CD), a magnet optical disk (MO), a memory card, or the like.

[Supercritical Drying Processing]

Now, an IPA drying mechanism using a processing fluid (for example, carbon dioxide ($CO_2$)) in a supercritical state will be briefly explained with reference to FIG. 5A to FIG. 5D.

Figure 5A:
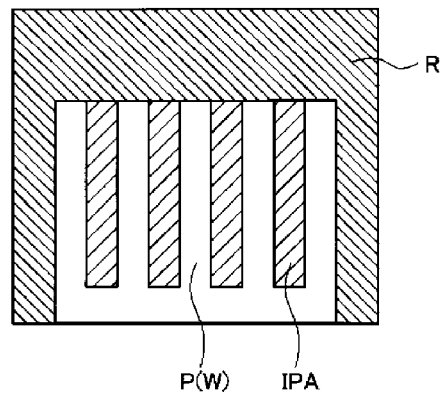
FIG. 5A to FIG. 5D are diagrams for describing a drying mechanism of IPA.

Immediately after the processing fluid R in the supercritical state is introduced into the processing vessel 301, only IPA exists within a recess of a pattern P of a wafer W, as illustrated in FIG. 5A.

Figure 5B:
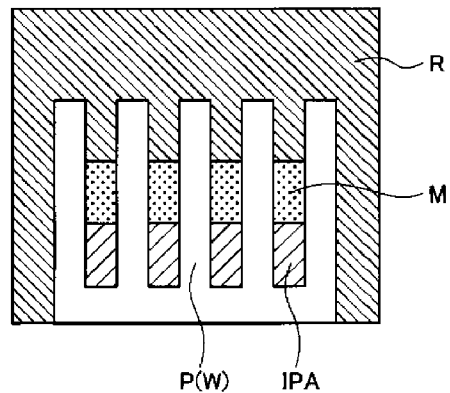

The IPA within the recess is slowly dissolved in the processing fluid R as it comes into contact with the processing fluid R in the supercritical state, so that the IPA is slowly replaced by the processing fluid R, as shown in FIG. 5B. At this time, not only the IPA and the processing fluid R but a mixed fluid M in which the IPA and the processing fluid R are mixed also exists within the recess.

Figure 5C:
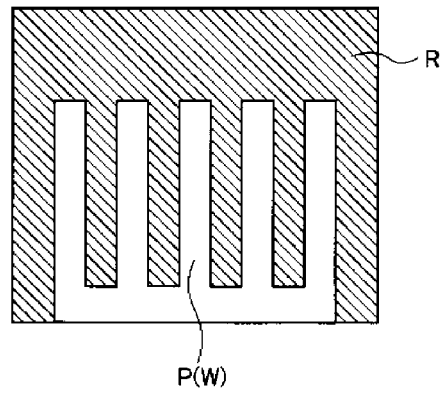

With the progress of the replacement of the IPA with the processing fluid R within the recess, the IPA existing within the recess declines, and, finally, only the processing fluid R in the supercritical state remains within the recess, as shown in FIG. 5C.

Figure 5D:
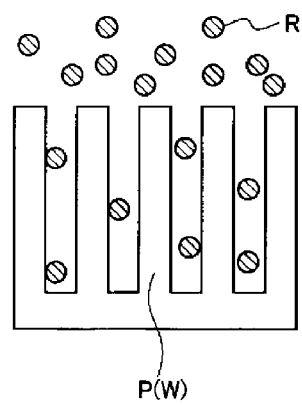

After the IPA is removed from the inside of the recess, the pressure within the processing vessel 301 is reduced to an atmospheric pressure. Accordingly, as illustrated in FIG. 5D, the processing fluid R is turned into a gas state from the supercritical state, and the inside of the recess is only occupied by the gas. In this way, the IPA within the recess of the pattern P is removed, and the drying processing for the wafer W is completed.

Meanwhile, in the drying processing using the processing fluid R in the substrate processing system 1 described so far, a pattern collapse may occur. The present inventors have investigated the reason for the pattern collapse repeatedly and found out that a temperature of the IPA within the recess increases due to heat of the processing fluid R and a part of the IPA thus evaporates before the IPA within the recess is replaced by the processing fluid R. Further, it is also found out that if the drying processing is performed by setting the temperature of the processing fluid R to be of a level at which the evaporation of the IPA hardly occurs, the IPA is difficult to dissolve in the processing fluid R in the supercritical state and the IPA may not be sufficiently replaced by the processing fluid R in the supercritical state, making it easy for the pattern collapse to take place.

The present inventors have repeated further researches based on these investigations and found out that the temperature rise and the evaporation of the IPA before the replacement by the processing fluid R in the supercritical state can be suppressed by adjusting a temperature of the wafer W appropriately in a period during which the pressure within the processing vessel 301 is increased and, thus, the pattern collapse can be suppressed. By way of example, it is found out that the pattern collapse can be suppressed by setting the temperature of the wafer W to be a first temperature until the pressure within the processing vessel 301 reaches a predetermined first pressure and then setting the temperature of the wafer W to be a second temperature higher than the first temperature after the pressure within the processing vessel 301 reaches the first pressure.

The first temperature may be set to be a temperature (e.g., 80° C.~90° C.) at which the IPA hardly evaporates before being replaced. The second temperature may be set to be a temperature (e.g., 100° C.~120° C.) at which the IPA is easily dissolved in the processing fluid R in the supercritical state. The first pressure may be set to be higher than a threshold pressure of the processing fluid R. When $CO_2$ is used as the processing fluid R, the first pressure may be set to be, e.g., 8 MPa higher than 7 MPa which is the threshold pressure of the $CO_2$.

First Exemplary Embodiment

Figure 6:
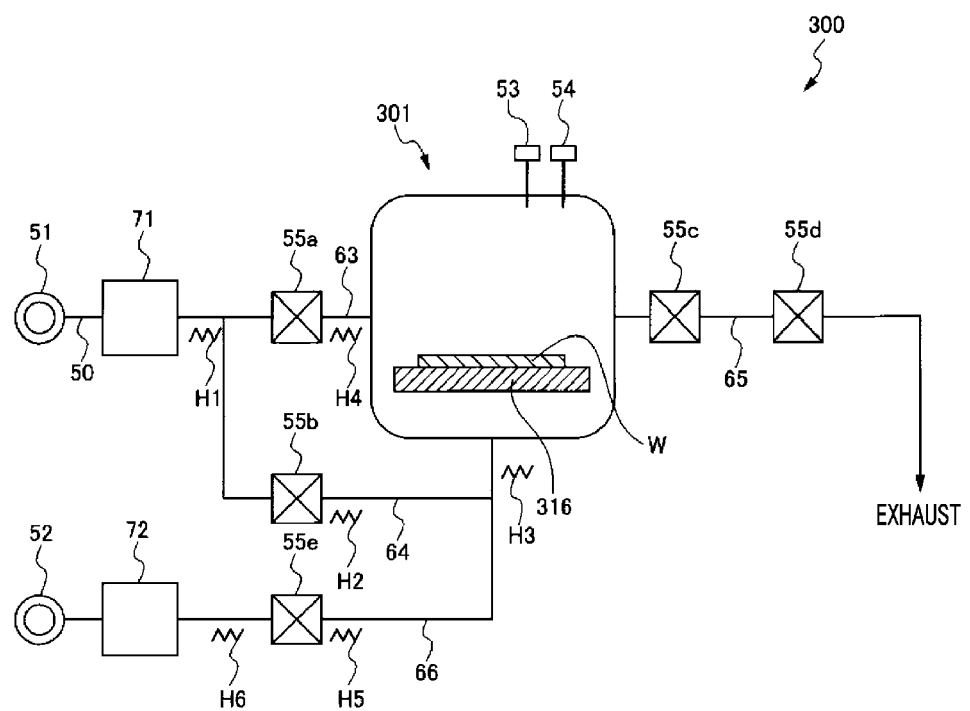
FIG. 6 is a diagram illustrating a piping system of a supercritical processing apparatus belonging to a substrate processing apparatus according to a first exemplary embodiment.

A substrate processing apparatus according to a first exemplary embodiment having a configuration suitable for the adjustment of the temperature of the wafer W will be explained. FIG. 6 is a piping system of a supercritical processing apparatus belonging to the substrate processing apparatus of the first exemplary embodiment.

As depicted in FIG. 6, the supercritical processing apparatus 300 provided in the substrate processing apparatus according to the first exemplary embodiment is equipped with, in addition to the components of the supercritical processing apparatus 3 shown in FIG. 4, a fluid supply tank 52 serving as a supply source for a processing fluid. A third supply line 66 is connected to the fluid supply tank 52. The third supply line 66 is connected to a second supply line 64 at a downstream side of an opening/closing valve 55b. That is, the third supply line 66 is connected to a fluid supply nozzle 341.

A vaporizer 72 and an opening/closing valve 55e are provided between the fluid supply tank 52 and the fluid supply nozzle 341 (that is, at the third supply line 66) in this sequence from an upstream side. The vaporizer 72 vaporizes the processing fluid supplied from the fluid supply tank 52 and supplies a gas of a preset temperature to a downstream side. The third supply line 66 is connected to the second supply line 64 at a downstream side of the opening/closing valve 55e.

A line heater H6 is provided between the vaporizer 72 and the opening/closing valve 55e. A line heater H5 is provided between the opening/closing valve 55e and a joint point where the third supply line 66 is connected to the second supply line 64. Set temperatures of the line heaters H5 and H6 can be controlled by the controller 4 independently.

By way of example, a first path includes the third supply line 66 and a part of the second supply line 64. The vaporizer 72 is an example of a first vaporizer. By way of example, a second path includes a main supply line 50, a first supply line 63 and the second supply line 64. A vaporizer 71 is an example of a second vaporizer. By way of example, a first fluid supply unit includes the main supply line 50, the second supply line 64, the third supply line 66, and the fluid supply nozzle 341. By way of example, a second fluid supply unit includes the main supply line 50, the first supply line 63, a fluid supply header 317. For example, a fluid drain unit includes a fluid drain header 318 and a drain line 65.

In the first exemplary embodiment, the vaporizer 71 vaporizes a processing fluid supplied from a fluid supply tank 51 to a gas of a second temperature, e.g., 100° C. 120° C. The vaporizer 72 vaporizes the processing fluid supplied from the fluid supply tank 52 to a gas of a first temperature, e.g., 80° C.~90° C. The second temperature is higher than the first temperature.

Now, a drying method (substrate processing method) performed by using the supercritical processing apparatus 300 in the first exemplary embodiment will be discussed. The drying method to be described below is automatically performed under the control of the controller 4 based on a processing recipe and a control program stored in the storage unit 19. FIG. 7 to FIG. 10 are diagrams for illustrating an outline of the drying method (substrate processing method) according to the first exemplary embodiment.

<Carry-in Process>

A wafer W after being subjected to a cleaning processing in the cleaning apparatus 2 is carried out of the cleaning apparatus 2 by the second transfer device 161 in the state that a recess of a pattern formed on a surface of the wafer W is filled with IPA and a puddle of the IPA is formed on the surface of the wafer W. The second transfer device 161 places the wafer W on the holding plate 316, and the holding plate 316 having the wafer W thereon is advanced into the vessel main body 311, and the cover member 315 is fitted into the vessel main body 311 hermetically. Through these operations, the carrying-in of the wafer W is completed.

After the carry-in process, $CO_2$, for example, is supplied into the processing vessel 301 as a processing fluid R, and a drying processing for the wafer W is performed by using the $CO_2$.

<First Pressure Raising Process>

Figure 7:
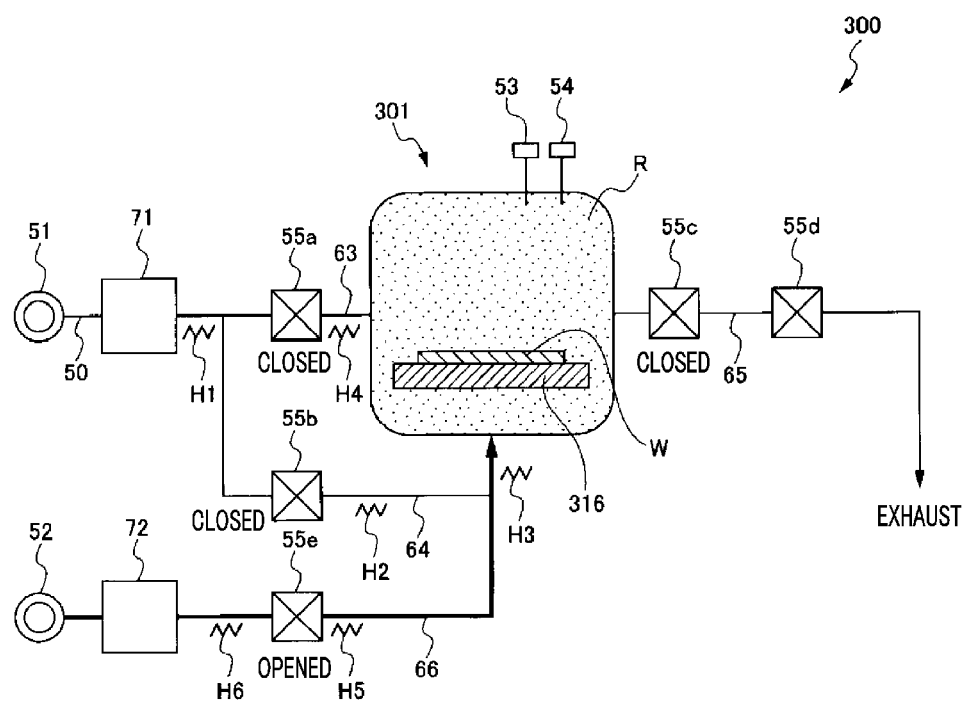
FIG. 7 is a first diagram illustrating an outline of a drying method in the first exemplary embodiment.

First, a first pressure raising process is carried out. In the first pressure raising process, the $CO_2$ as the processing fluid R is supplied into the processing vessel 301 from the fluid supply tank 52. To elaborate, as depicted in FIG. 7, the opening/closing valve 55e is opened, whereas the opening/closing valves 55a, 55b and 55c are closed. Accordingly, the $CO_2$ having the first temperature is supplied from the fluid supply tank 52 toward a bottom surface of the holding plate 316 from the fluid supply nozzle 341 which is located directly under a central portion of the wafer W. As the $CO_2$ of the first temperature is supplied into the processing vessel 301, a temperature of the wafer W is changed to the first temperature.

The $CO_2$ discharged from the fluid supply nozzle 341 (as indicated by an arrow F1 in FIG. 3) is diffused radially along the bottom surface of the holding plate 316 (as indicated by an arrow F2 in FIG. 3) after colliding with the holding plate 316 which covers a bottom surface of the wafer W, and is then introduced into a space at a top surface side of the wafer W through a gap between an edge of the holding plate 316 and a sidewall of the vessel main body 311 and the opening 316a of the holding plate 316 (as indicted by an arrow F3 in FIG. 3). Since the opening/closing valve 55c is closed, the $CO_2$ does not leak from the processing vessel 301. As a result, the pressure within the processing vessel 301 increases gradually.

In the first pressure raising process, a pressure of the $CO_2$ introduced into the processing vessel 301 is lower than a threshold pressure thereof (e.g., about 7 MPa). Accordingly, the $CO_2$ is introduced into the processing vessel 301 in a gas state. Then, as the $CO_2$ is filled in the processing vessel 301, the pressure within the processing vessel 301 increases. If the pressure within the processing vessel 301 exceeds the threshold pressure, the $CO_2$ existing within the processing vessel 301 is turned into a supercritical state. If the $CO_2$ within the processing vessel 301 is turned into the supercritical state, IPA on the wafer W starts to be dissolved in the $CO_2$ in the supercritical state. Accordingly, a mixing ratio between the IPA and the $CO_2$ in a mixed fluid including the $CO_2$ and the IPA is changed.

The pressure within the processing vessel 301 is detected by the pressure sensor 53, and the first pressure raising process is continued until the pressure within the processing vessel 301 reaches the first pressure, e.g., 8 MPa.

<Second Pressure Raising Process>

Figure 8:
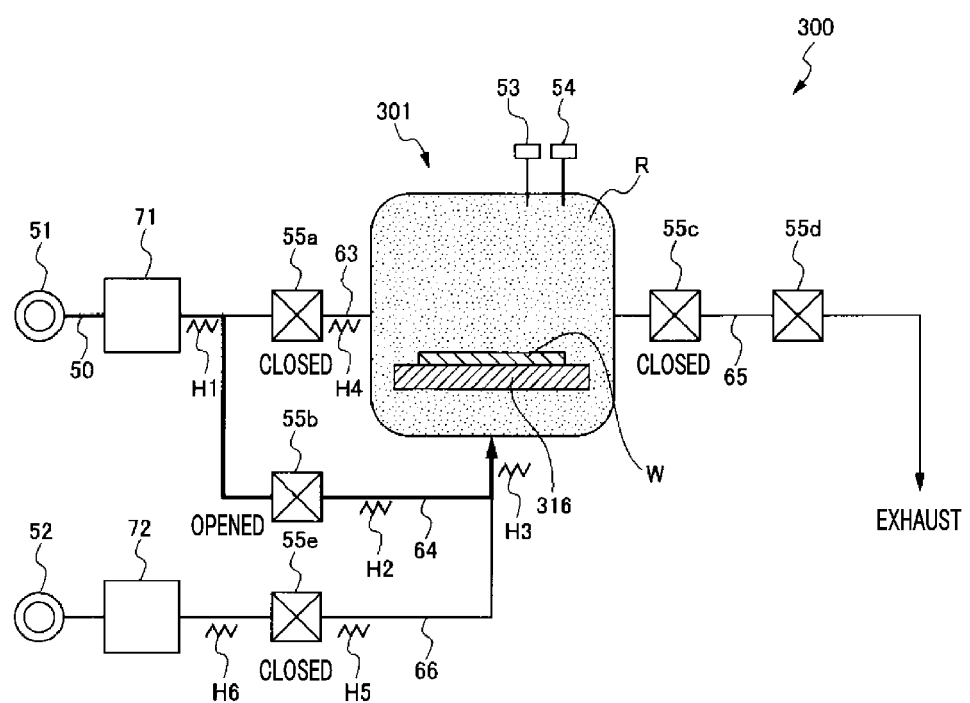
FIG. 8 is a second diagram illustrating the outline of the drying method in the first exemplary embodiment.

If the pressure within the processing vessel 301 reaches the first pressure, e.g., 8 MPa, the first pressure raising process is ended, and a second pressure raising process is begun. In the second pressure raising process, a supply path for the $CO_2$ into the processing vessel 301 is changed. To elaborate, as depicted in FIG. 8, the opening/closing valve 55b is opened, whereas the opening/closing valves 55a, 55c and 55e are closed. Accordingly, the $CO_2$ having the second temperature is discharged from the fluid supply tank 51 toward the bottom surface of the holding plate 316 from the fluid supply nozzle 341 which is located directly under the central portion of the wafer W. That is, the temperature of the $CO_2$ to be supplied into the processing vessel 301 increases rapidly. As the $CO_2$ of the second temperature is supplied into the processing vessel 301, the temperature of the wafer W is changed to the second temperature rapidly.

The mixing ratio between the IPA and the $CO_2$ may not be uniform on the entire surface of the wafer W. To suppress a pattern collapse that might be caused by unexpected evaporation of the mixed fluid, the pressure within the processing vessel 301 is increased in the second pressure raising process up to a pressure (here, 15 MPa) at which the $CO_2$ within the processing vessel 301 certainly turns into the supercritical state regardless of a concentration of the $CO_2$ in the mixed fluid. Here, the "pressure at which the $CO_2$ certainly turns into the supercritical state" refers to a pressure higher than a maximum value of the threshold pressure on a graph showing a variation of the threshold pressure with respect to a threshold temperature. This pressure (15 MPa) is referred to as "processing pressure." The first pressure is lower than the processing pressure. In a period during which the pressure within the processing vessel 301 increases from the first pressure (8 MPa) to the processing pressure (15 MPa), the $CO_2$ having the second temperature is continuously supplied into the processing vessel 301 from the fluid supply nozzle 341 through the opening/closing valve 55b.

<Flowing Process>

Figure 9:
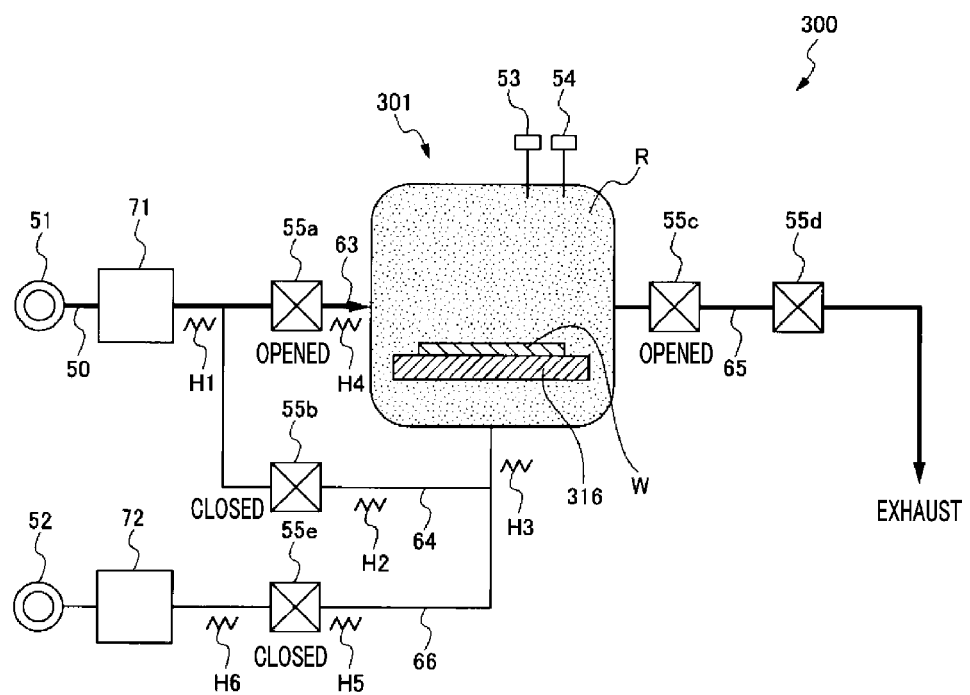
FIG. 9 is a third diagram illustrating the outline of the drying method in the first exemplary embodiment.

A flowing process is performed after the second pressure raising process. In the flowing process, the $CO_2$ having the second temperature from the fluid supply tank 51 is supplied through the opening/closing valve 55a and introduced into the processing vessel 301 through the fluid supply header 317. To elaborate, as illustrated in FIG. 9, the opening/closing valves 55a and 55c are opened, whereas the opening/closing valves 55b and 55e are closed. Accordingly, the $CO_2$ of the second temperature from the fluid supply tank 51 is supplied into the processing vessel 301 by using the fluid supply header 317 (as indicated by an arrow F4 in FIG. 3). The fluid supply header 317 is capable of supplying the $CO_2$ at a larger flow rate, as compared to the fluid supply nozzle 341. In the flowing process, since the pressure within the processing vessel 301 is maintained at a level sufficiently higher than the threshold pressure, there is caused no problem in drying even if the $CO_2$ having the large flow rate collides with the surface of the wafer W or flows near the surface of the wafer W. For this reason, the fluid supply header 317 is used to shorten a processing time. Further, the wafer W is maintained at the second temperature during the flowing process.

In the flowing process, since the $CO_2$ is supplied into the processing vessel 301 through the fluid supply header 317 and the $CO_2$ is exhausted from the processing vessel 301 through the fluid drain header 318, a laminar flow of the $CO_2$ flowing substantially in parallel with the surface of the wafer W is formed within the processing vessel 301 (as indicated by an arrow F6 in FIG. 3).

Through the flowing process, the replacement of the IPA by the $CO_2$ within the recess of the pattern of the wafer W is accelerated. With the progress of the replacement of the IPA by the $CO_2$ within the recess, the threshold pressure of the mixed fluid is reduced.

<Draining Process>

Figure 10:
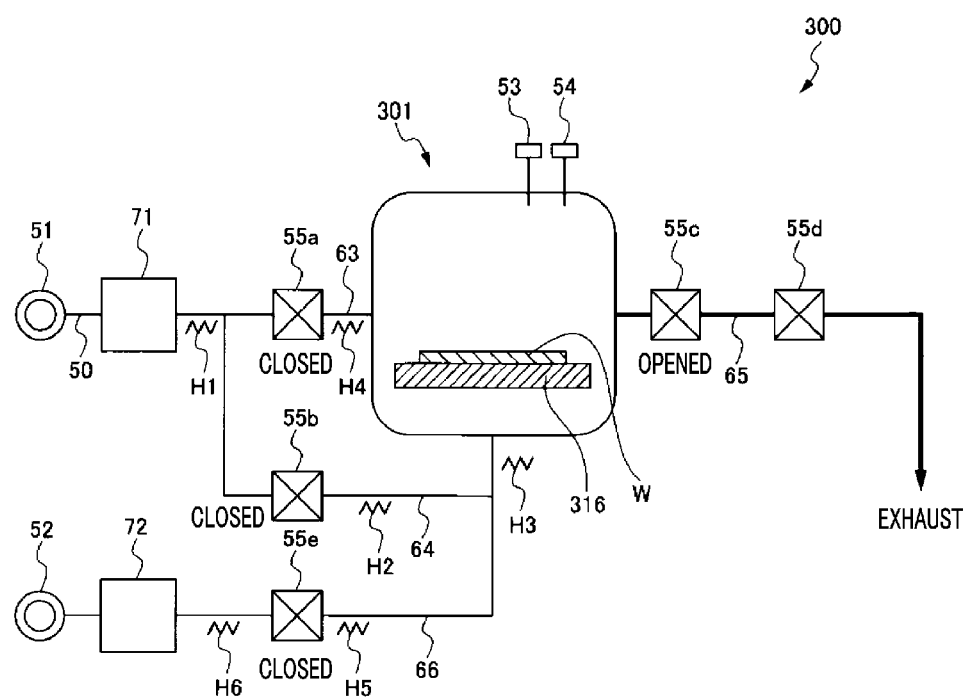
FIG. 10 is a fourth diagram illustrating the outline of the drying method in the first exemplary embodiment.

If the replacement of the IPA by the $CO_2$ within the recess of the pattern is completed through the flowing process, a draining process is carried out. In the draining process, the opening/closing valve 55c is opened, and the opening/closing valves 55a, 55b and 55e are closed, as shown in FIG. 10. If the pressure within the processing vessel 301 becomes lower than the threshold pressure of the $CO_2$ through the draining process, the $CO_2$ in the supercritical state is vaporized and removed from the recess of the pattern. Then, the drying processing upon the single sheet of wafer W is ended.

According to the first exemplary embodiment, in the first pressure raising process and the second pressure raising process, the $CO_2$ is supplied into the processing vessel 301 from the fluid supply nozzle 341 located under the wafer W. Therefore, a pattern collapse can be suppressed more securely. This effect will be elaborated below.

If the IPA in a liquid state existing on the surface of the wafer W is exposed to the flow of the $CO_2$ in a gas state, the IPA may evaporate, and there is a concern that a pattern collapse may occur at this time. In the first pressure raising process and the second pressure raising process, if the $CO_2$ in the gas state is supplied into the processing vessel 301 from the fluid supply header 317 located at the side of the wafer W, the flow of the $CO_2$ having a relatively high flow velocity may collide with a puddle of the IPA directly or passes near the puddle of the IPA. As a result, the IPA tends to evaporate easily.

In contrast, in the present exemplary embodiment, the $CO_2$ discharged from the fluid supply nozzle 341 does not directly flow toward the surface of the wafer W or a space near the surface of the wafer W, but is diffused radially along the bottom surface of the holding plate 316 after colliding with a central portion of the bottom surface of the holding plate 316 and then introduced into a space at a top surface side of the wafer W. That is, in the present exemplary embodiment, there exists no flow of the $CO_2$ flowing directly toward the surface of the wafer W or the space near the surface of the wafer W from a processing fluid discharge port. As a result, evaporation of the IPA that might be caused by the supply of the $CO_2$ in the gas state into the processing vessel 301 is suppressed greatly. Further, when the $CO_2$ in the gas state is introduced into the space at the top surface side of the wafer W, the flow velocity of the $CO_2$ is reduced to be much smaller than a flow rate thereof when it is discharged from the fluid supply nozzle 341. Accordingly, the evaporation of the IPA is further suppressed.

Furthermore, since the $CO_2$ supplied into the processing vessel 301 in the first pressure raising process has the first temperature at which the IPA hardly evaporates, the wafer W becomes to have the first temperature as well, so that evaporation of the IPA by heat of the $CO_2$ may not take place easily. Thus, a pattern collapse that might be caused by the evaporation of the IPA can be further suppressed.

Moreover, since the $CO_2$ supplied into the processing vessel 301 in the second pressure raising process and the flowing process has the second temperature which is higher than the first temperature and which allows the IPA to be easily dissolved in the $CO_2$ in the supercritical state, the wafer W becomes to have the second temperature as well, thus allowing the IPA to be easily dissolved in the $CO_2$ in the supercritical state. Thus, a pattern collapse that might be caused by insufficient replacement can be suppressed.

In addition, since the $CO_2$ of the first temperature is supplied from the vaporizer 72 and the $CO_2$ of the second temperature is supplied from the vaporizer 71, the temperature of the $CO_2$ supplied into the processing vessel 301 can be rapidly changed, thus allowing the temperature of the wafer W to be rapidly changed as well. By changing the temperature of the wafer W rapidly, a standby time taken before the temperature is stabilized can be shortened, and, thus, productivity can be improved. Further, since the IPA evaporates slowly even during the time when the temperature of the wafer W is being changed, a larger amount of IPA can evaporate with a rise of the standby time. According to the first exemplary embodiment, however, by changing the temperature rapidly, the standby time can be shortened, and the evaporation of the IPA can be suppressed.

In the first exemplary embodiment, the $CO_2$ is supplied into the processing vessel 301 only from the fluid supply nozzle 341 throughout the whole period of the first pressure raising process and the second pressure raising process, the present exemplary embodiment is not limited thereto. By way of example, in the second pressure raising process, the $CO_2$ may be supplied into the processing vessel 301 from the fluid supply header 317, or the $CO_2$ may be supplied into the processing vessel 301 from both the fluid supply header 317 and the fluid supply nozzle 341. In this case as well, a pattern collapse can be suppressed.

However, as in the first exemplary embodiment, it is desirable that the $CO_2$ is supplied into the processing vessel 301 only from the fluid supply nozzle 341 during the whole period of the first pressure raising process and the second pressure raising process. If the $CO_2$ is supplied into the processing vessel 301 from the fluid supply header 317, the supplied $CO_2$ may directly collide with a puddle of the IPA or a puddle of the mixed fluid including the IPA and the $CO_2$ and agitate the puddle, raising a likelihood that a particle may be generated. Further, by supplying the $CO_2$ only from the fluid supply nozzle 341, a pattern collapse can be suppressed more securely.

By using the fluid supply header 317, a pressure rise speed can be increased as compared to the case where the fluid supply nozzle 341 is used. Thus, depending on a required particle level, the $CO_2$ may be supplied into the processing vessel 301 by using the fluid supply header 317 in the second pressure raising process to thereby improve a throughput.

Second Exemplary Embodiment

Figure 11A:
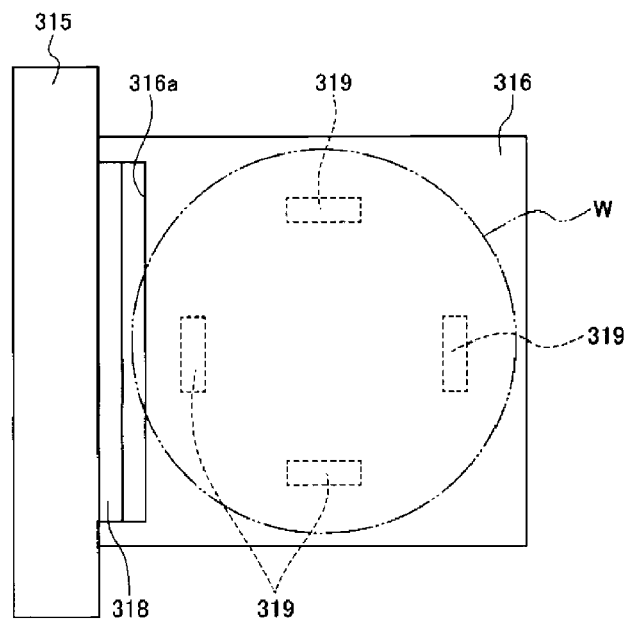
FIG. 11A and FIG. 11B are diagrams illustrating a holding plate included in a substrate processing apparatus according to a second exemplary embodiment.
Figure 11B:
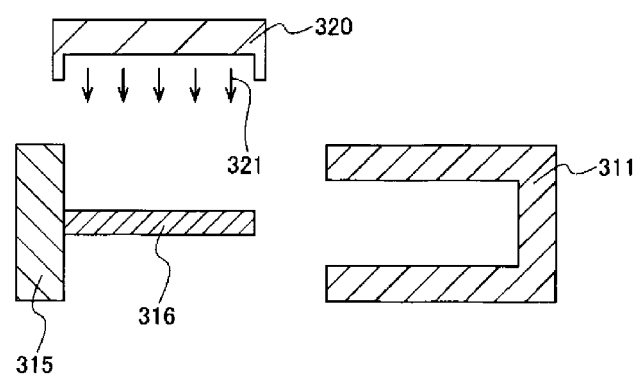

Now, a substrate processing apparatus according to a second exemplary embodiment having a configuration suitable for adjustment of a temperature of a wafer W will be explained. FIG. 11A and FIG. 11B are diagrams illustrating a holding plate included in the substrate processing apparatus according to the second exemplary embodiment. FIG. 11A is a top view illustrating the holding plate, and FIG. 11B is a cross sectional view illustrating a cooling device configured to cool the holding plate.

A supercritical processing apparatus 3 provided in the substrate processing apparatus according to the second exemplary embodiment may be, by way of example, the supercritical processing apparatus 3 shown in FIG. 4. In the second exemplary embodiment, the vaporizer 71 vaporizes a processing fluid supplied from the fluid supply tank 51 to a gas having a third temperature. The third temperature may be equal to the first temperature or the second temperature or may be higher than the first temperature and lower than the second temperature.

As shown in FIG. 11A, a holding plate 316 provided in the substrate processing apparatus according to the second exemplary embodiment is equipped with temperature control devices 319. Each temperature control device 319 is configured to adjust a temperature of the holding plate 316. The temperature control device 319 includes, by way of non-limiting example, a heater and a Peltier device. The temperature control device 319 is capable of adjusting the temperature of at least the holding plate 316 to the first temperature or the second temperature.

As depicted in FIG. 11B, a cover member 315 and the holding plate 316 can be placed at an outside of a vessel main body 311 while they wait for a transfer of the wafer. In the second exemplary embodiment, there is provided a cooling device 320 configured to cool the holding plate 316 while the holding plate 316 is placed at the outside of the vessel main body 311, waiting for the transfer of the wafer W. The cooling device 320 may be, by way of non-limiting example, an air blower configured to blow dry air 321 to the holding plate 316. The dry air 321 may have a room temperature ranging from, e.g., 10° C. to 30° C.

Though positions where the temperature control devices 319 are provided are not particularly limited, it is desirable that the temperature control devices 319 are equi-spaced on a single circle equidistant from a center of the wafer W in a circumferential direction of the wafer W in order to adjust the temperature of the wafer W uniformly.

Now, a drying method (substrate processing method) performed by using the supercritical processing apparatus 3 shown in FIG. 4 according to the second exemplary embodiment will be explained. Further, the drying method to be described below is automatically performed under the control of the controller 4 based on a processing recipe and a control program stored in the storage unit 19.

<Carry-in Process>

The same as in the first exemplary embodiment, a wafer W having a recess of a pattern formed on a surface thereof is placed on the holding plate 316 in the state that an inside of the recess is filled with IPA and a puddle of the IPA is formed on the surface of the wafer W. Then, the holding plate 316 having the wafer W thereon is advanced into the vessel main body 311, and the cover member 315 is fitted into the vessel main body 311 hermetically. Further, the holding plate 316 is kept at the outside of the vessel main body 311 until the wafer W is placed thereon, and the dry air 321 is jetted to the holding plate 316 by the cooling device 320. As a result, by the time when the wafer W is placed on the holding plate 316, the holding plate 316 is set to the room temperature ranging from, 10° C. to 30° C.

After the carry-in process, $CO_2$, for example, is supplied into the processing vessel 301 as a processing fluid R, and a drying processing for the wafer W using the $CO_2$ is performed.

<First Pressure Raising Process>

First, a first pressure raising process is performed. In the first pressure raising process, the $CO_2$ as the processing fluid R is supplied into the processing vessel 301 from the fluid supply tank 51. That is, the opening/closing valve 55b is opened, and the opening/closing valves 55a and 55c are closed. Accordingly, the $CO_2$ having the third temperature from the fluid supply tank 51 is discharged toward a bottom surface of the holding plate 316 from the fluid supply nozzle 341 which is located directly under a central portion of the wafer W. Further, the controller 4 controls an output of the temperature control devices 319, thus allowing the temperature of the holding plate 316 to be adjusted to the first temperature by the temperature control device 319. As the temperature of the holding plate 316 is adjusted to the first temperature, a temperature of the wafer W is changed to the first temperature. Though the temperature of the wafer W is also affected by heat of the $CO_2$ supplied into the processing vessel 301, it is more affected by the temperature of the holding plate 316 holding the wafer W.

The same as in the first exemplary embodiment, as the $CO_2$ is discharged from the fluid supply nozzle 341, a pressure within the processing vessel 301 increases slowly. If the pressure within the processing vessel 301 exceeds a threshold pressure, the $CO_2$ within the processing vessel 301 is turned into a supercritical state, and the IPA on the wafer W starts to be dissolved in the $CO_2$ in the supercritical state. As a result, a mixing ratio between the IPA and the $CO_2$ in a mixed fluid including the IPA and the $CO_2$ is changed.

The pressure within the processing vessel 301 is detected by the pressure sensor 53, and the first pressure raising process is continued until the internal pressure of the processing vessel 301 reaches the first pressure, e.g., 8 MPa.

<Second Pressure Raising Process>

If the pressure within the processing vessel 301 reaches the first pressure, e.g., 8 MPa, the first pressure raising process is ended, and a second pressure raising process is begun. In the second pressure raising process, a set temperature of the temperature control device 319 is changed. To elaborate, the set temperature of the temperature control devices 319 is set to the second temperature, and the controller 4 controls the outputs of the temperature control devices 319, thus allowing the temperature of the holding plate 316 to be adjusted to the second temperature by the temperature control device 319. Accordingly, the temperature of the holding plate 316 is rapidly increased. As the temperature of the holding plate 316 is increased, the temperature of the wafer W is changed to the second temperature. In the second pressure raising process, the opening/closing valve 55b is opened, and the opening/closing valves 55a and 55c are closed. Accordingly, the $CO_2$ having the third temperature from the fluid supply tank 51 is continuously discharged toward the bottom surface of the holding plate 316 from the fluid supply nozzle 341.

In the second exemplary embodiment as well, the pressure within the processing vessel 301 is raised to a pressure (here, 15 MPa) at which the $CO_2$ within the processing vessel 301 is certainly turned into the supercritical state regardless of a concentration of the $CO_2$ in the mixed fluid. While the pressure within the processing vessel 301 is being raised to the processing pressure (15 MPa) from the first pressure (8 MPa), the $CO_2$ having the third temperature is continuously supplied into the processing vessel 301 from the fluid supply nozzle 341 through the opening/closing valve 55b.

<Flowing Process>

After the second pressure raising process, a flowing process is performed. In the flowing process, the $CO_2$ of the third temperature from the fluid supply tank 51 is supplied through the opening/closing valve 55a and is introduced into the processing vessel 301 through the fluid supply nozzle 341. To elaborate, the opening/closing valves 55a and 55c are opened, whereas the opening/closing valve 55b is closed. Accordingly, the $CO_2$ of the third temperature from the fluid supply tank 51 is supplied into the processing vessel 301 by using the fluid supply header 317 (as indicated by an arrow F4 in FIG. 3). During the flowing process, the set temperature of the temperature control device 319 is maintained at the second temperature, and, accordingly, the temperature of the wafer W is maintained at the second temperature.

<Draining Processing>

If replacement of the IPA by the $CO_2$ within the recess of the pattern is completed through the flowing process, a draining process is performed. In the draining process, the opening/closing valve 55c is opened, and the opening/closing valves 55a and 55b are closed. In the draining process, the temperature control devices 319 may be turned off. That is, the adjustment of the temperature of the holding plate 316 may be stopped. If the pressure within the processing vessel 301 is reduced to be lower than the threshold pressure of the $CO_2$ through the draining process, the $CO_2$ in the supercritical state is vaporized and removed from the inside of the recess of the pattern. Then, the drying processing upon the single sheet of wafer W is ended.

After the draining process, the holding plate 316 having the wafer W thereon is moved to the outside of the vessel main body 311, and the wafer W is delivered onto the second transfer device 161. Then, the cooling device 320 jets the dry air 321 toward the holding plate 316. As a result, the temperature of the holding plate 316 is adjusted to the room temperature approximately.

While the drying processing upon the single sheet of wafer W is being performed, set temperatures of the heaters H1 to H4 may be maintained constant. The set temperatures of the heaters H1 to H4 may be same, or some or all of the set temperatures may be different.

In the second exemplary embodiment, since the temperature of the wafer W is appropriately adjusted in the first pressure raising process and the second pressure raising process, the same effects as obtained in the first exemplary embodiment can be achieved.

Further, since the holding plate 316 is cooled to the room temperature approximately while the holding plate 316 stands by for the wafer W, non-uniformity in the temperature of the holding plate 316 at the beginning of the first pressure raising process can be suppressed. Thus, it is easy to adjust the temperature of the holding plate 316 to the first temperature in the first pressure raising process.

Third Exemplary Embodiment

Now, a substrate processing apparatus according to a third exemplary embodiment having a configuration suitable for adjustment of a temperature of a wafer W will be explained. As in the second exemplary embodiment, a supercritical processing apparatus 3 provided in the substrate processing apparatus according to the third exemplary embodiment may be, by way of example, the supercritical processing apparatus 3 shown in FIG. 4. In the third exemplary embodiment as well, the vaporizer 71 is capable of vaporizing a processing fluid supplied from the fluid supply tank 51 to a gas having the third temperature. In the third exemplary embodiments, the set temperatures of the heaters H1 to H4 are appropriately changed.

A drying method (substrate processing method) performed by using the supercritical processing apparatus 3 shown in FIG. 4 according to the third exemplary embodiment will be explained. Further, the drying method to be described below is automatically performed under the control of the controller 4 based on a processing recipe and a control program stored in the storage unit 19.

<Carry-in Process>

The same as in the first exemplary embodiment, a wafer W having a recess of a pattern formed on a surface thereof is placed on the holding plate 316 in the state that an inside of the recess is filled with IPA and a puddle of the IPA is formed on the surface of the wafer W. Then, the holding plate 316 having the wafer W thereon is advanced into the vessel main body 311, and the cover member 315 is fitted into the vessel main body 311 hermetically.

After the carry-in process, $CO_2$, for example, is supplied into the processing vessel 301 as a processing fluid R, and a drying processing for the wafer W using the $CO_2$ is performed.

<First Pressure Raising Process>

First, a first pressure raising process is performed. The $CO_2$ as the processing fluid R is supplied into the processing vessel 301 from the fluid supply tank 51. That is, the opening/closing valve 55b is opened, and the opening/closing valves 55a and 55c are closed. Accordingly, the $CO_2$ from the fluid supply tank 51 is discharged toward the bottom surface of the holding plate 316 through the fluid supply nozzle 341 placed directly under a central portion of the wafer W. Further, a combination of set temperatures of the heaters H1 to H4 is set to a first combination. The first combination is a combination of the set temperatures of the heaters H1 to H4 by which the $CO_2$ supplied into the processing vessel 301 through the main supply line 50 and the second supply line 64 provided with the heaters H1, H2 and H3 becomes to have the first temperature. The controller 4 controls outputs of the heaters H1 to H4, thus allowing the $CO_2$ having the first temperature to be supplied into the processing vessel 301. As the $CO_2$ of the first temperature is supplied into the processing vessel 301, a temperature of the wafer W is changed to the first temperature as well.

As in the first exemplary embodiment, as the $CO_2$ is discharged from the fluid supply nozzle 341, a pressure within the processing vessel 301 increases slowly. If the pressure within the processing vessel 301 exceeds a threshold pressure, the $CO_2$ within the processing vessel 301 is turned into a supercritical state, and the IPA on the wafer W starts to be dissolved in the $CO_2$ in the supercritical state. As a result, a mixing ratio between the IPA and the $CO_2$ in a mixed fluid including the IPA and the $CO_2$ is changed.

The pressure within the processing vessel 301 is detected by the pressure sensor 53, and the first pressure raising process is continued until the internal pressure of the processing vessel 301 reaches the first pressure, e.g., 8 MPa.

<Second Pressure Raising Process>

If the pressure within the processing vessel 301 reaches the first pressure, e.g., 8 MPa, the first pressure raising process is ended, and a second pressure raising process is begun. In the second pressure raising process, the combination of the set temperatures of the heaters H1 to H4 is changed to a second combination. The second combination is a combination of the set temperatures of the heaters H1 to H4 by which the $CO_2$ supplied into the processing vessel 301 through the main supply line 50 and the second supply line 64 provided with the heaters H1, H2 and H3 becomes to have the second temperature. The controller 4 controls the outputs of the heaters H1 to H4, thus allowing the $CO_2$ having the second temperature to be supplied into the processing vessel 301. As the $CO_2$ of the second temperature is supplied into the processing vessel 301, a temperature of the wafer W is changed to the second temperature as well. In the second pressure raising process, the opening/closing valve 55b is opened, and the opening/closing valves 55a and 55c are closed, thus allowing the $CO_2$ of the third temperature from the fluid supply tank 51 to be continuously discharged toward the bottom surface of the holding plate 316 from the fluid supply nozzle 341.

In the third exemplary embodiment as well, the pressure within the processing vessel 301 is increased up to a pressure (here, 15 MPa) at which the $CO_2$ within the processing vessel 301 certainly turns into the supercritical state regardless of a concentration of the $CO_2$ in the mixed fluid. During the increase of the pressure of the $CO_2$ within the processing vessel 301 from the first pressure (8 MPa) to the processing pressure (15 MPa), the $CO_2$ having the second temperature is continuously supplied into the processing vessel 301 from the fluid supply nozzle 341 after passing through the opening/closing valve 55b.

<Flowing Process>

After the second pressure raising process, a flowing process is performed. In the flowing process, the $CO_2$ of the third temperature from the fluid supply tank 51 is supplied through the opening/closing valve 55a and is introduced into the processing vessel 301 through the fluid supply header 317. To elaborate, the opening/closing valves 55a and 55c are opened, whereas the opening/closing valve 55b is closed.

Further, the combination of the set temperatures of the heaters H1 to H4 is changed to a third combination. The third combination is a combination of the set temperatures of the heaters H1 to H4 by which the $CO_2$ supplied into the processing vessel 301 through the main supply line 50 and the first supply line 63 provided with the heater H1 and the heater H4 becomes to have the second temperature. The third combination may be coincident with the second combination. Accordingly, the $CO_2$ having the second temperature is supplied into the processing vessel 301 by using the fluid supply header 317 (as indicated by the arrow F4 in FIG. 3). During the flowing process, the temperature of the wafer W is maintained at the second temperature.

<Draining Processing>

If replacement of IPA by the $CO_2$ within the recess of the pattern of the wafer W is completed through the flowing process, a draining process is performed. In the draining process, the opening/closing valve 55c is opened, and the opening/closing valves 55a and 55b are closed. In the draining process, the combination of the set temperature of the heaters H1 to H4 may be changed to the first combination. If the pressure within the processing vessel 301 is reduced to be lower than the threshold pressure of the $CO_2$ through the draining process, the $CO_2$ in the supercritical state is vaporized and removed from the inside of the recess of the pattern. Accordingly, the drying processing upon the single sheet of wafer W is ended.

In the third exemplary embodiment as well, the temperature of the wafer W is appropriately adjusted in the first pressure raising process and the second pressure raising process. Thus, as in the first exemplary embodiment, a pattern collapse can be suppressed.

Further, in the second exemplary embodiment and the third exemplary embodiment, the supercritical processing apparatus 300 shown in FIG. 6 may be used instead of the supercritical processing apparatus 3 shown in FIG. 4. By way of example, in the first pressure raising process, it may be possible to perform the control over the outputs of the temperature control devices 319 or perform the control over the outputs of the line heaters H1, H2, H3, H5 and H6 while supplying the $CO_2$ of the first temperature by using the vaporizer 72. Moreover, by combining the second exemplary embodiment and the third exemplary embodiment, it may be possible to perform the control over the outputs of the line heaters H1, H2 and H3 while performing the control over the temperature control devices 319.

(Cleaning Method)

In any of the various exemplary embodiments, a particle may adhere to the wafer in the drying processing. The present inventors have conducted various researches to suppress the adhesion of the particle to the wafer. Through the repeated researches, the present inventors have found out that it is effective to clean the inside of the processing vessel 301 between individual drying processings by using a processing fluid in a supercritical state. The present inventors have conducted further researches to improve cleaning efficiency. Through these researches, it is found out that cleaning efficiency can be improved by repeating pressure raising and pressure lowering in a cleaning processing, rather than flowing the processing fluid while maintaining the pressure within the processing vessel 301 constant.

An experiment regarding the cleaning efficiency, which is conducted by the present inventors, will be explained. FIG. 12A to FIG. 12D are schematic diagrams showing the contents of the experiment regarding the cleaning efficiency.

Figure 12A:
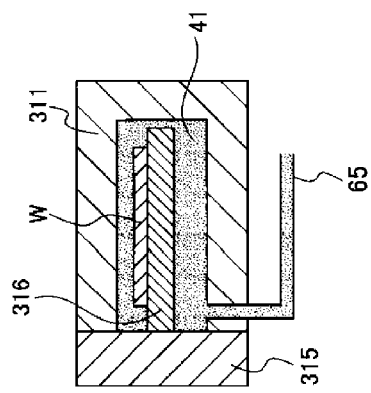
FIG. 12A to FIG. 12D are schematic diagrams showing the contents of an experiment regarding cleaning efficiency.
Figure 12B:
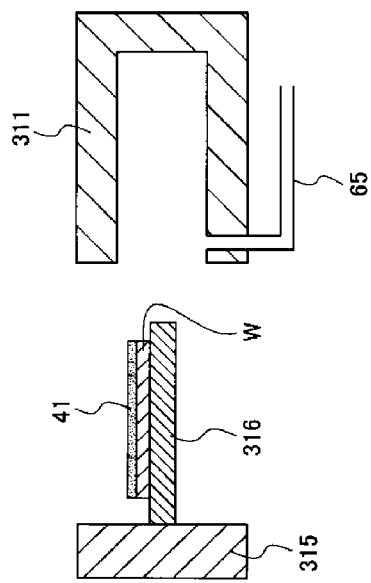
Figure 12C:
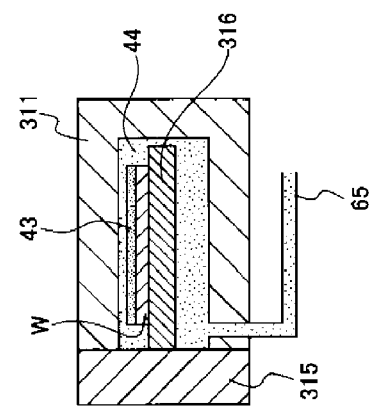
Figure 12D:
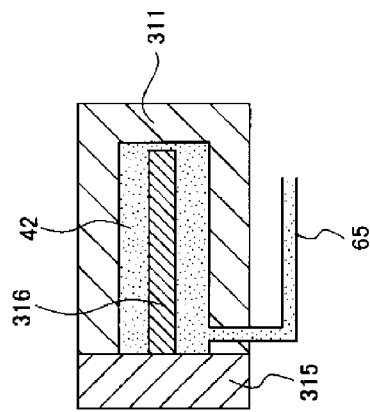
Figure 13A:
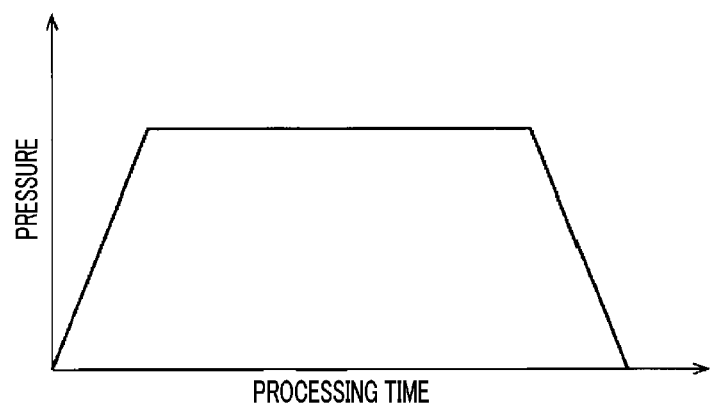
FIG. 13A and FIG. 13B are diagrams illustrating a pressure variation when cleaning is performed.
Figure 13B:
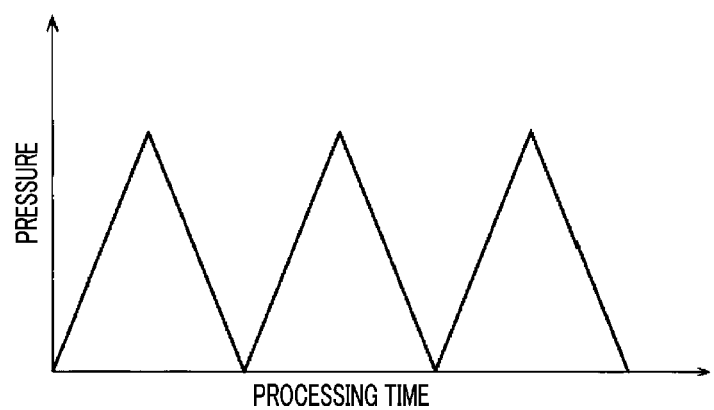

First, as depicted in FIG. 12A, a wafer W having a puddle of IPA 41 formed on a surface thereof is placed on the holding plate 316, and transferred into the vessel main body 311. Then, as shown in FIG. 12B, the IPA 41 is vaporized by natural drying within the vessel main body 311. Some of the vaporized IPA 41 adhere to the vessel main body 311 and the drain line 65. Thereafter, as depicted in FIG. 12C, cleaning of the vessel main body 311 and the drain line 65 is performed by using a processing fluid 42. This cleaning is performed in two different methods. FIG. 13A and FIG. 13B are diagrams showing a pressure variation in the cleaning processing. In the first method, the processing fluid 42 is continuously flown while maintaining inside of the processing vessel 301 at a constant processing pressure, as shown in FIG. 13A. In the second method, raising and lowering of the processing pressure are repeated, as shown in FIG. 13B. $CO_2$ in a supercritical state is used as the processing fluid 42. FIG. 13B shows an example where the pressure raising and the pressure lowering are repeated three times. After the cleaning, a drying processing for another wafer W having a puddle of IPA 41 on a surface thereof is performed, as depicted in FIG. 12D. In this cleaning processing, a temperature of the wafer W in the pressure raising processing is maintained constant without considering a pattern collapse.

Then, particles are counted after the drying processing. If the number of the particles increased from before the drying processing is less than a predetermined threshold value, the result is assumed to be "Evaluation A." If the number of the particles increased from before the drying processing is larger than a threshold value, on the other hand, the result is assumed to be "Evaluation B."

In the first method, a processing time for the flowing process (hereinafter, referred to as "flowing time") is set to be 0 sec, 100 sec, 400 sec, 500 sec and 600 sec, and in the second method, a repetition number of the pressure raising and the pressure lowering is set to be 0, 2, 3, 4, and 5. Five evaluations are consecutively made for each condition (each flowing time and each repetition numbers). The number of Evaluation A and the number of Evaluation B for each flowing time in the first method are shown in Table 1, and the number of Evaluation A and the number of Evaluation B for each repetition number are shown in Table 2.

TABLE 1

First method

| Flowing time (sec) | Number of Evaluation A | Number of Evaluation B |
| --- | --- | --- |
| 0 | 3 | 2 |
| 100 | 4 | 1 |
| 400 | 4 | 1 |
| 500 | 5 | 0 |
| 600 | 5 | 0 |

TABLE 2

Second method

| Repetition number | Number of Evaluation A | Number of Evaluation B |
| --- | --- | --- |
| 0 | 3 | 2 |
| 2 | 4 | 1 |
| 3 | 5 | 0 |
| 4 | 5 | 0 |
| 5 | 5 | 0 |

In this experiment, in the first method, by setting the flowing time to be equal to or larger than 500 sec, an increment of the particles can be made to be less than a threshold value in all the drying processings. Further, in the second method, by repeating the pressure raising and the pressure lowering three times or more, the increment of the particles can be made to be less than the threshold value in all the drying processings. In the first method, the temperature raising is required before the flowing process, and the temperature lowering is needed after the flowing process. A total processing time when repeating the pressure raising and the pressure lowering three times in the second method is equivalent to about 57% of a total processing time (a sum of a pressure raising time and a pressure lowering time) when the pressure raising and the pressure lowering are performed during the flowing time of 500 seconds in the first method. Furthermore, a total consumption amount of the $CO_2$ used in the drying processing when repeating the pressure raising and the pressure lowering three times in the second method is equivalent to about 33% of a total consumption amount of the $CO_2$ consumed when the pressure raising and the pressure lowering are performed and during the flowing time of 500 seconds in the first method.

As can be seen from the result, according to the second method, the total processing time and the total consumption amount of the processing fluid required to suppress the increase of the particles can be reduced largely, as compared to the first method. That is, according to the second method, higher cleaning efficiency than in the first method can be achieved.

Further, in the above-described various exemplary embodiments, the fluid supply nozzle 341 is placed at, for example, the position directly under the central portion of the wafer W accommodated in the processing vessel 301. However, the position of the fluid supply nozzle 341 is not limited thereto. It is desirable that the fluid supply nozzle 341 is placed under the holding plate 316, that is, a position where the fluid supply nozzle 341 is not seen when the holding plate 316 on which the wafer W is placed is seen from directly above it. That is, it is desirable that the fluid supply nozzle 341 is located at a position allowing the $CO_2$ gas discharged from the fluid supply nozzle 341 collides with a bottom surface of the holding plate 316 or a rear surface (bottom surface) of the wafer W.

Here, however, if the position of the fluid supply nozzle 341 is largely deviated from directly under the central portion of the wafer W, the flow of the $CO_2$ gas within the processing vessel 301 becomes non-uniform, and the $CO_2$ gas may reach the surface of the wafer W. In view of this, it is desirable to place the fluid supply nozzle 341 at a position close to the position directly under the central portion of the wafer W. Furthermore, to prevent or suppress the flow of the $CO_2$ gas from reaching the surface of the wafer W, it is desirable that the fluid supply nozzle 341 discharges the $CO_2$ vertically upwards or substantially straight upwards.

A maintaining process may be performed between the second pressure raising process and the flowing process. For example, after the pressure within the processing vessel 301 is raised to the processing pressure (15 MPa), the processing may not rapidly proceed to the flowing process but the pressure within the processing vessel 301 may be maintained.

Additionally, in the above-described various exemplary embodiments, though the individual processes are performed according to a variation of the pressure within the processing vessel 301, a relationship between an elapsed time of the processing and the variation of the pressure within the processing vessel 301 may be previously acquired, and the individual processes may be performed based on the elapsed time. In this case as well, the variation of the pressure within the processing vessel 301 and the progress of the processing is related.

So far, the various exemplary embodiments have been described. However, the exemplary embodiments are not limiting, and various modifications and replacements may be made without departing from the scope of the present disclosure as claimed in the following claims.

By way of example, the processing fluid for use in the drying processing may be a fluid (for example, a fluorine-based gas) other than the $CO_2$, and any of various fluids capable of removing, in a supercritical state, a liquid for dry prevention accumulated on the substrate can be used as the processing fluid. Further, the liquid for dry prevention is not limited to the IPA, either, and various other kinds of liquid capable of preventing drying may be utilized. The substrate as a target of the processing is not limited to the aforementioned semiconductor wafer W, and may be any of various other kinds of substrates such as an LCD glass substrate, a ceramic substrate, and so forth.

According to the present disclosure, it is possible to suppress a collapse of a pattern formed on the surface of the substrate.

From the foregoing, it will be appreciated that the various embodiments of the present disclosure have been described herein for the purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A substrate processing apparatus configured to dry a substrate, which has a liquid attached on a surface thereof, by using a processing fluid in a supercritical state, the substrate processing apparatus comprising:
   a processing vessel configured to accommodate the substrate therein;
   a substrate holder configured to hold the substrate horizontally such that the surface of the substrate faces upwards within the processing vessel;
   a fluid supply unit configured to supply the processing fluid into the processing vessel;
   a fluid drain unit configured to drain the processing fluid from the processing vessel; and
   a controller configured to control at least operations of the fluid supply unit and the fluid drain unit and a temperature of the substrate held by the substrate holder,
   wherein the controller controls the operations of the fluid supply unit and the fluid drain unit, the controller configured to:
   increase a pressure within the processing vessel up to a processing pressure higher than a threshold pressure of the processing fluid by supplying the processing fluid into the processing vessel in which the substrate having the liquid attached on the surface thereof is accommodated; and
   supply the processing fluid into the processing vessel and drain the processing fluid from the processing vessel while maintaining the pressure within the processing vessel at a level allowing the processing fluid to be maintained in the supercritical state, after the pressure within the processing vessel is increased to the processing pressure, wherein in order to increase the pressure within the processing vessel up to the processing pressure the controller is configured to:
increase the pressure within the processing vessel to a first pressure higher than the threshold pressure and lower than the processing pressure; and
increase the pressure within the processing vessel to the processing pressure from the first pressure, and
wherein the controller is configured to control the temperature of the substrate to a first temperature in increasing of the pressure within the processing vessel to the first pressure, and
the controller is configured to control the temperature of the substrate to a second temperature higher than the first temperature in increasing of the pressure within the processing vessel to the processing pressure from the first pressure,
wherein the first temperature ranges from 80° C. to 90° C., at which the liquid attached on the surface is refrained from being evaporated before being replaced with the processing fluid, and wherein the liquid is isopropyl alcohol.

2. The substrate processing apparatus of claim 1,
wherein the fluid supply unit comprises:
a first path through which the processing fluid whose temperature is adjusted to the first temperature is supplied into the processing vessel; and
a second path through which the processing fluid whose temperature is adjusted to the second temperature higher than the first temperature is supplied into the processing vessel.

3. The substrate processing apparatus of claim 2, further comprising:
a first vaporizer provided in the first path, and configured to vaporize the processing fluid to a gas of the first temperature; and
a second vaporizer provided in the second path, and configured to vaporize the processing fluid to a gas of the second temperature.

4. The substrate processing apparatus of claim 3,
wherein the fluid supply unit comprises:
a first fluid supply configured to supply the processing fluid into the processing vessel from below the substrate held by the substrate holder; and
a second fluid supply configured to supply the processing fluid into the processing vessel from a lateral side of the substrate held by the substrate holder,
wherein the first fluid supply includes the first path and a part of the second path, and
the second fluid supply includes a part of the second path.

5. The substrate processing apparatus of claim 1, further comprising:
a temperature control device provided at the substrate holder and controlled by the controller.

6. The substrate processing apparatus of claim 1,
wherein the fluid supply unit comprises:
a supply line of the processing fluid; and
a heater provided at the supply line, and
wherein the controller is configured to control the temperature of the substrate by adjusting a temperature of the processing fluid supplied into the processing vessel under a control of the heater.

* * * * *